United States Patent [19]

Stefani et al.

[11] Patent Number: 4,916,408
[45] Date of Patent: Apr. 10, 1990

[54] POWER STAGE WITH INCREASED OUTPUT DYNAMICS

[75] Inventors: Fabrizio Stefani, Varese; Alberto Gola, Pavia; Gianluigi Pessina, Milano, all of Italy

[73] Assignee: SGS-Thomson Microelectronics S.r.l., Agrate Brianza Mi, Italy

[21] Appl. No.: 277,078

[22] Filed: Nov. 28, 1988

[30] Foreign Application Priority Data

Dec. 3, 1987 [IT] Italy .................. 22880 A/87

[51] Int. Cl.$^4$ ............................................. H03F 3/45
[52] U.S. Cl. ..................................... 330/255; 330/260
[58] Field of Search .............. 330/252, 255, 257, 260, 330/261, 263, 295, 311

[56] References Cited

U.S. PATENT DOCUMENTS 4,401,950  8/1983  Davis .................. 330/255

FOREIGN PATENT DOCUMENTS 2028042  2/1980  United Kingdom ............... 330/255

Primary Examiner—Steven Mottola
Attorney, Agent, or Firm—Guido Modiano; Albert Josif

[57] ABSTRACT

An improved power stage with increased output dynamics. The stage comprises a power amplifier having a first inverting input, a second non-inverting input, an output to be connected to a load and a feedback network comprising a first resistor connected between the inverting input and the output of the power amplifier and a second resistor connected between the first inverting input and a first line set to a first reference voltage by means of a voltage generator with preset values. The stage furthermore comprises an input voltage generator generating an input voltage signal to be amplified and connected between the second non-inverting input and a second line set to a second reference voltage different from said first reference voltage. In order to increase the output dynamics, in particular in the case of low power supply voltage, said voltage generator arranged between the second resistor and said input voltage generator, and generating a voltage which is variable in inverse proportion to the input voltage signal, with respect to the second reference voltage.

5 Claims, 2 Drawing Sheets

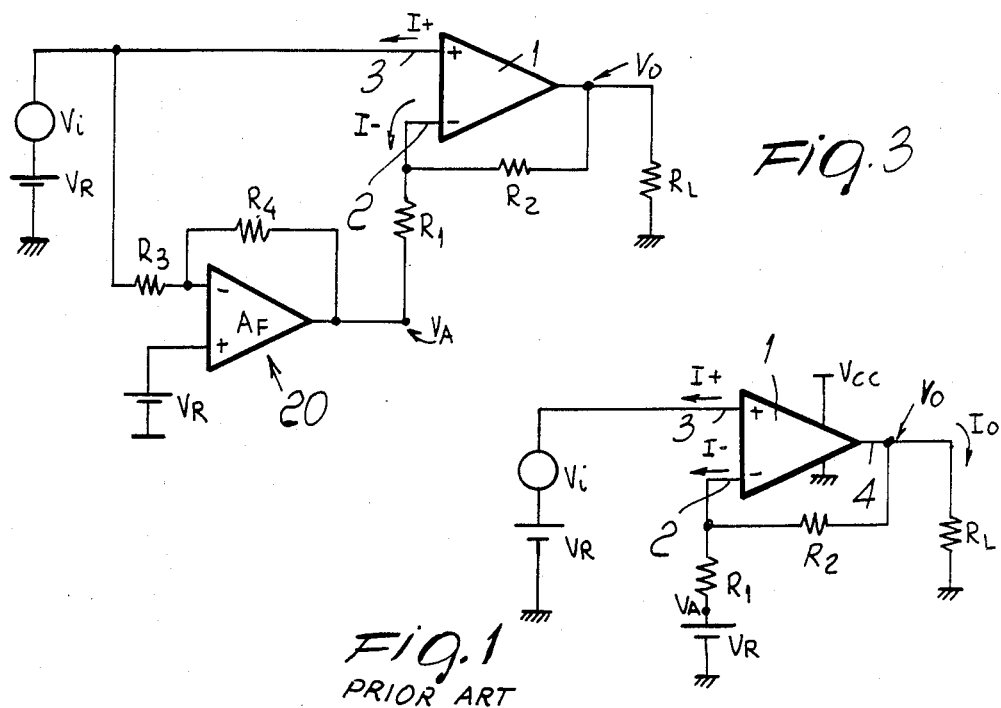
Fig. 3
Fig. 1 PRIOR ART
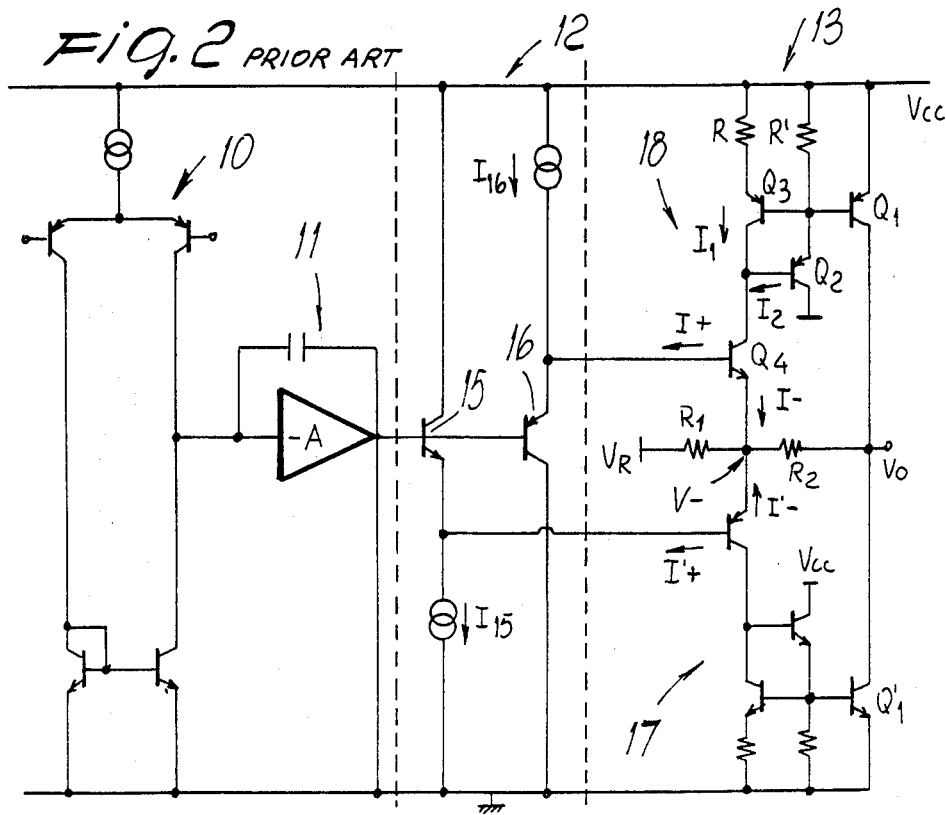
Fig. 2 PRIOR ART

POWER STAGE WITH INCREASED OUTPUT DYNAMICS

BACKGROUND OF THE INVENTION

The present invention relates to an improved power stage with increased output dynamics.

In particular, the invention relates to a power stage having the simplified layout illustrated in FIG. 1, comprising a power amplifier 1 having an inverting input 2, a non-inverting input 3 and an output 4 to be connected to a load $R_L$. The stage furthermore comprises a feedback network comprising a resistor $R_2$ connected between the inverting input 2 and the output 4 and a second resistor $R_1$ connected, with a first terminal, to the inverting input 2 and, with a second terminal, to a first reference voltage (in this case the ground) through a reference voltage source $V_R$. The non-inverting input 3 of the amplifier 1 receives the signal to be amplified $V_i$ raised with respect to the ground by the reference voltage $V_R$. The figure furthermore illustrates the biasing currents I+, I− respectively of the non-inverting input 3 and of the inverting input 2.

If no signal is applied (i.e. when $V_i=0$) the output voltage $V_o$ is equal to the reference voltage $V_R$ which, in the applications in which a single power supply line is used, such as the one illustrated in FIG. 1, is equal to half of the supply voltage.

If the biasing currents I+, I− can be considered negligible, the output signal $V_o$ is a function of the input signal $V_i$ according to the expression:

$$V_o = \frac{R_1 + R_2}{R_1} V_i + V_R \quad (1)$$

When the open-loop gain of the stage is not sufficiently high, or with a particular circuital configuration (as will become apparent in the exemplifying circuit described hereafter) if the load absorbs a high-value current $I_o$ the biasing currents I+,I− may have appreciable values. Relation (1) is consequently no longer a good approximation of the real behavior of the power stage. In this case, in particular, the dynamic characteristics of the amplifier are reduced considerably. The possibility of saturating the transistors comprised in the power stage is limited, this limitation being relatively onerous, since in power applications the condition that the transistors must operate in saturation is often forced.

In fact, if $V_M$ defines the highest value attainable by the inverting terminal of the amplifier, the maximum current which can flow through the resistor $R_1$ is naturally given by:

$$\frac{V_M - V_R}{R_1}$$

if the condition:

$$I_{sat} \gtrsim \frac{V_M - V_R}{R_1}$$

is met; ignoring the current flowing through the resistor $R_2$ and designating $I_{sat}$ the input biasing current in saturation, the stage cannot sustain the saturated output towards the more positive voltage. The same is true for the saturation for the more negative voltage.

This problem is particularly apparent when low power supply voltages are used in battery-operated systems.

In order to clarify this concept, reference should be made to the exemplifying circuit illustrated in FIG. 2, showing an operational power amplifier as disclosed in the U.S. patent application No. 180,742 filed on Apr. 12, 1988 in the name of the same Applicant. Said operational power amplifier allows a high dynamics of the output signal, which can approach the power supply voltages less the drop $V_{CE,sat}$ on the output transistor $Q_1$ or $Q_1'$ in saturation.

The circuit illustrated in FIG. 2 comprises, in a conventional manner, a differential input stage 10, an amplifier 11 with gain −A, a buffer stage 12 and the power output stage 13. As the input stage 10 and the amplifier 11 are fully conventional and their description is not important for understanding the operation of the circuit, they are not described. The buffer stage 12 and the output stage 13 are instead illustrated in greater detail. The latter is equivalent to the simplified diagram illustrated in FIG. 1, so that the same reference numerals have been used. As can be seen, the buffer stage 12 comprises a pair of transistors 15, 16 fed by respective current sources $I_{15}$, $I_{16}$ adapted to drive respectively the lower stage 17 and the upper stage 18 of the power output section 13. Each stage 17, 18 (with particular reference to the upper one 18) comprises a pair of driving transistors $Q_3$, $Q_4$ for driving the output power transistor $Q_1$. A further transistor $Q_2$ has its emitter connected to the bases of the transistors $Q_1$, $Q_3$ and its base connected to the collector of $Q_3$ so as to recover the base current of the output power transistor $Q_1$. The figure also illustrates the feedback network constituted by the resistor $R_1$, which has one terminal connected to the reference voltage $V_R$ and its other terminal connected to the emitter of the transistor $Q_4$ (point V−), and by the resistor $R_2$ connected between the point V− and the output having the voltage $V_o$. The circuit furthermore comprises the resistors R and R' connected between the emitter and the base of $Q_3$ and the power supply $V_{CC}$.

Regarding the operation, consider the case in which the output $V_o$ tends to the more positive voltage; the following description can be obviously repeated symmetrically if the output tends to the more negative voltage. From the analysis of FIG. 2 it is obvious to the man skilled in the art that the current I+ does not create excessive problems provided that the current source $I_{16}$ is adequately dimensioned. The issue is different for the current I−, which is equal to the sum of $I_1$, (the current flowing through the transistor $Q_3$), and of $I_2$, (the base current of the transistor $Q_2$). In correct operating conditions said current I− must flow entirely through the resistor $R_1$. By inspecting the network it can be stated that the maximum value $V_{MAX}$ of the voltage at the inverting terminal V− is approximately:

$$V_{MAX} \approx V_{CC} - V_{BE1,sat} - V_{BE2} - V_{CE4,sat}$$

wherein $V_{BE1,sat}$ is the base-emitter voltage drop of $Q_1$ in saturation, $V_{BE2}$ is the base-emitter voltage drop of $Q_2$, and $V_{CE4,sat}$ is the collector-emitter voltage drop of the transistor $Q_4$ in saturation.

Assuming that $$V_R = V_{CC}/2$$

the maximum current which can flow through the resistor $R_1$ is given by:

$$I_{MAX} \approx \frac{V_{CC}/2 - V_{BE1,sat} - V_{BE2} - V_{CE4,sat}}{R_1} \quad (2)$$

For supply voltages comprised between 3 and 4 V the numerator of (2) becomes a very small voltage.

In order to obtain the required operation in saturation it is therefore necessary to force the following condition:

$$I_{MAX} \gtrsim I_{sat}$$

to obtain the saturation of $Q_4$.

Various solutions are known for satisfying this condition.

In particular, a first solution keeps the value of $R_1$ and therefore of $R_2$ sufficiently low. This solution however is disadvantageous since it entails a high current consumption of the stage in saturation conditions.

Another solution makes the emitter junction area of the transistor $Q_2$ large enough to reduce the weight of the current $I_2$. However, this solution, is disadvantageous too, due to the considerable increase in the dimensions of the integrated circuit.

Another solution gives the degeneration resistor R a sufficiently high value or increases the area ratio of the emitter junctions of the transistors $Q_1$ and $Q_3$ to reduce the weight of the current $I_1$. However, this solution is disadvantageous too, since the rest current flowing through the power transistors in output becomes very high, increasing thus their dissipation.

A final solution keeps the reference voltage $V_R$ at a value lower than $V_{CC}/2$. However, this solution, too, is not advantageous due to the asymmetries which occur in the operation of the circuit.

SUMMARY OF THE INVENTION

Given this situation, the aim of the present invention is to provide an improved power stage capable of solving the disadvantages of the current art and in particular of increasing the output dynamics of the stage, allowing it to operate even with low supply voltages.

Within the scope of this aim, a particular object of the present invention is to provide a power stage reliably allowing the saturation of the transistors at its output, as often required in power applications.

Another object of the present invention is to provide a power stage having reliable operation in terms of its stability, and in particular not requiring the use of positive feedbacks.

Still another object of the present invention is to provide a power stage of the above mentioned type with a reduced area smaller than that of solutions with increased emitter junction area (for the transistor recovering the base current of the output power transistor).

Not least object of the present invention is to provide a power stage of the above described type which is structurally simple in concept, requires the use of per se known components which therefore have thoroughly controllable characteristics, and can be easily integrated using conventional machines and processes of the electronics industry.

This aim, the mentioned objects and other which will become apparent hereinafter are achieved by an improved power stage with increased output dynamics, as defined in the accompanying claims.

BRIEF DESCRIPTION OF THE DRAWINGS

Further characteristics and advantages of the invention will become apparent from the description of a preferred but not exculsive embodiment, illustrated only by way of non-limitative example in the accompanying drawings, wherein:

FIG. 1 is a general circuit diagram of a known power stage;

FIG. 2 is a more detailed circuit diagram comprising the known power stage according to FIG. 1;

FIG. 3 is a general circuit diagram of the power stage according to the invention, similar to the one of FIG. 1;

FIGS. 1 and 2 are not described hereafter; reference is made to the previous description.

DESCRIPTION OF THE PREFERRED EMBODIMENTS

Figure 4:
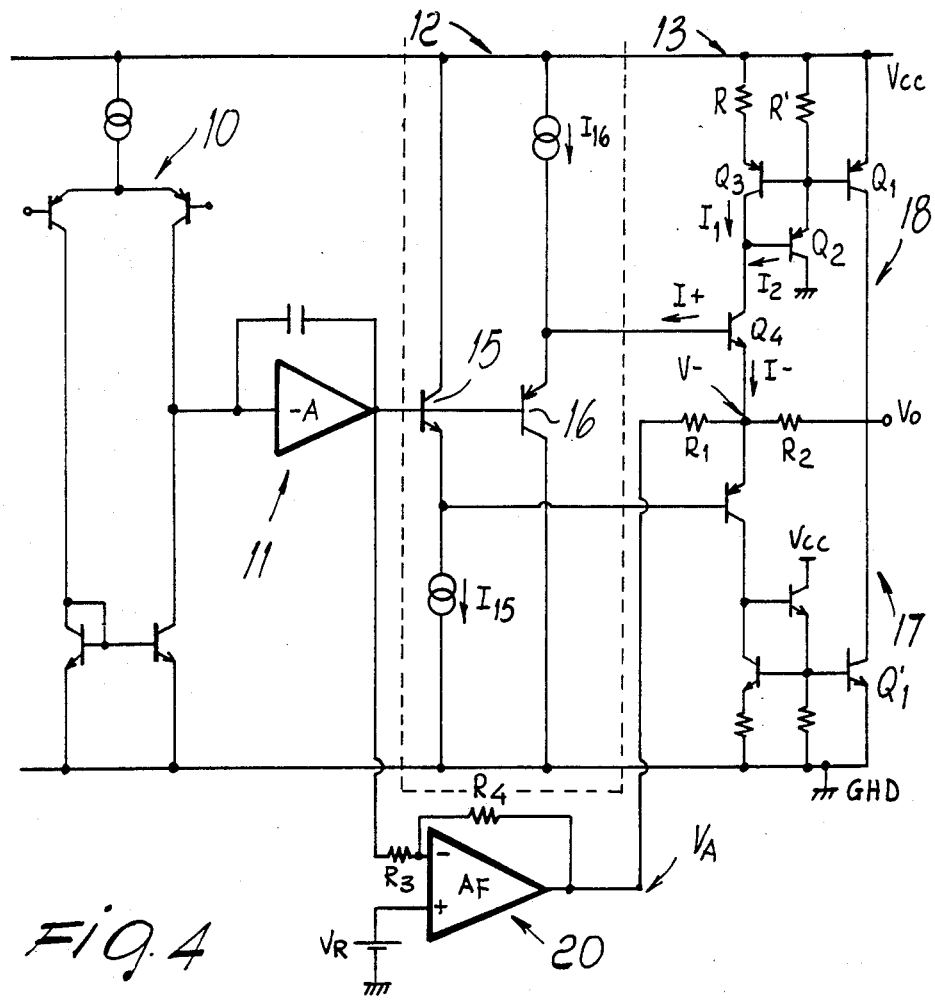
FIG. 4 is a more detailed circuit diagram of a circuit comprising the power stage illustrated in FIG. 3.

Reference should be made to FIG. 3 for the description of the power stage according to the invention; in FIG. 3, which is similar to FIG. 1, the parts in common with the known solution have been indicated by the same reference numerals for a better comparison of the characteristics of the invention. In detail, the power stage comprises the amplifier 1 with its non-inverting input 3 connected to the input signal $V_i$, referred to the reference voltage $V_R$, and with its inverting input 2 connected to the feedback network formed by $R_1$ and $R_2$. Differently from the known circuit of FIG. 1, the terminal of $R_1$ not connected to the input 2 is not at a fixed voltage with respect to the ground, but is connected to a section 20 generating a voltage which varies in inverse proportion to the input voltage $V_i$, referred to the reference voltage $V_R$. In fact, by analyzing the diagram of FIG. 1 it can be seen that in the known solution the voltage $V_A$ is always kept equal to the voltage $V_R$, regardless of the variation of the input signal. Actually this condition is necessary only when the input signal is nil (i.e. when $V_i=0$), so as to have $V_o=V_R$ and a nil current flowing through the feedback resistors $R_1$ and $R_2$. When the input signal is different from 0, the condition $V_A=V_R$ is redundant. According to the invention, therefore, the voltage $V_A$ is made to vary inversely to $V_i$ with respect to the reference voltage $V_R$, thus obtaining a significant increase in dynamics.

For this purpose the section 20 comprises an operation amplifier $A_F$ fedback by means of a further network of resistors $R_3$ and $R_4$ connected between the output and the inverting input of the operational amplifier. The other terminal of $R_3$ is connected to the non-inverting input 3 of the amplifier 1, while the non-inverting input of $A_F$ is connected to the reference voltage $V_R$.

Consequently, as can be seen by means of simple calculations, the stage 20 generates at the output a voltage $V_A$ having the following value:

$$V_A = V_R - V_i \frac{R_4}{R_3}$$

i.e. equal to $V_R$ with a nil input signal $V_i$ and otherwise inversely variable with respect to said input signal and referred to the reference voltage $V_R$.

Consequently, assuming the current I— to be negligible and setting $B=R_4/R_3$, the output voltage of the stage is given by:

$$V_o = \frac{R_1 + (B + 1) R_2}{R_1} V_i + V_R \qquad (3)$$

for the circuit of FIG. 3.

Expression (3) already indicates an increase in gain with respect to (1) for equal values of the resistors $R_1$ and $R_2$.

However the advantage of the invention does not reside in this characteristic. The maximum current which can flow through the resistor $R_1$ now in fact becomes $$I_{MAX} = \frac{V_M - V_{AF,sat}}{R_1}$$

in which $V_{AF,sat}$ is the minimum output voltage of the amplifier $A_F$, obtained when $V_i$ reaches the maximum allowed value. The dynamic possibilities of the power stage are thus increased. The variation of the voltage across $R_1$ is in fact increased, with respect to the known stage, by the amount $$\Delta V = V_R - V_{AF,sat}$$

To point out the advantages of the invention, reference should be again made to the power operation of FIG. 2, which according to the invention is modified as shown in FIG. 4, in which the reference numerals of the elements in common with FIG. 2 have again been maintained.

In the circuit of FIG. 4 expression (2), which yields the maximum current, is now modified as follows:

$$I_{MAX} \simeq \frac{V_{CC} - V_{BE1,sat} - V_{BE2} - V_{CE4,sat} - V_{AF,sat}}{R_1} \qquad (4)$$

Figure 5:
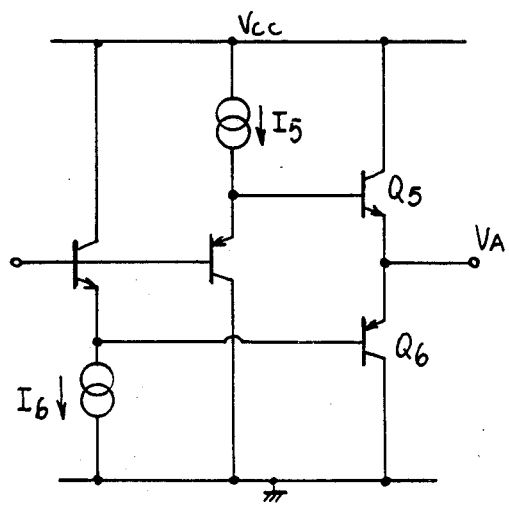
FIG. 5 is a detailed circuit diagram of a part of the circuit of FIG. 4.

If the amplifier $A_F$ is made of a conventional operation amplifier having the final stage illustrated in FIG. 5, it is certainly possible to assume:

$$V_{AF,sat} \simeq V_{BE} + V_{CE,sat}$$

wherein $V_{BE}$ is the base-emitter voltage drop on the transistor $Q_5$ or $Q_6$, and $V_{CE,sat}$ is the voltage drop respectively on the current source $I_5$ or $I_6$.

In this case the numerator of (4) yields a minimum voltage of approximately 0.5–0.6 V for supply voltages ($V_{CC}$) of 3 V.

As can be seen from the above description, the invention fully achieves the intended aim and objects. In fact, as has been shown, the insertion of an element capable of varying the reference voltage for the resistor $R_1$ according to the value of the input signal allows the correct operation of the device and the required saturation of the transistors even with low supply voltage values.

It is important to stress that the invention solves the proposed problem without using positive feedbacks which may entail problems in the stability of said circuit.

It should be furthermore noted that the illustrated solution is advantageous with respect to known solutions providing an increase in the area of the output transistor. The area increase required according to the known solution is in fact markedly larger than that required to actively drive the resistor $R_1$, as proposed by the invention. The amplifier $A_F$ can thus be easily inserted in the silicon area thus saved, obtaining a further area saving.

The solution is furthermore conceptually simple and reliable.

The invention thus conceived is susceptible to numerous modifications and variations, all of which are within the scope of the inventive concept. In particular, though the invention has been illustrated in detail with reference to a specific operational power circuit, it is in any case applicable to all power stages having a structure which can be schematically represented as in FIG. 1.

Furthermore all the details may be replaced with other technically equivalent elements.

We claim:

1. An improved power stage with increased output dynamics, comprising a power amplifier having a first inverting input, a second non-inverting input, an output to be connected to a load and a feedback network comprising a first resistor connected between the inverting input and the output of said amplifier and a second resistor connected between said first inverting input and a first line set to a first reference voltage means for generating a voltage drop, and a voltage source generating an input voltage signal to be amplified and connected between said second non-inverting input and a second line set to a second reference voltage different from the first reference voltage, said means for generating a voltage drop generating a voltage variable in inverse proportion to said input voltage signal and referred to said second reference voltage.

2. A power stage according to claim 1, wherein said means for generating a voltage drop comprises subtracting means for generating a signal equal to the difference between said second reference voltage and a value proportional to said input voltage signal.

3. A power stage according to claim 1, wherein said means for generating a voltage drop comprise an operational amplifier having its own inverting input, its own non-inverting input, its own output and its own feedback network comprising a third resistor connected between said own inverting input and said own output, and a fourth resistor connected between said own inverting input and said second non-inverting input of said power amplifier, said own non-inverting input being connected to said second line set to said second reference voltage.

4. An operational power circuit, comprising a differential input section, an amplifier section, a buffer section and an output power section, mutually cascade coupled, said amplifier section having an amplifier output generating an amplified signal, wherein said buffer and output power sections each comprise an upper stage and a lower stage, each of said lower and upper stages of the power section comprising a final power transistor connected between a line set to its own reference voltage and a circuit output, with a resistive feedback network comprising a first resistor connected between said circuit output and an input of said output power section and a second resistor connected with a first terminal thereof to said input of said output power section, said circuit further comprising a variable voltage source connected between said amplifier output and a second terminal of said second resistor, said variable voltage source generating a voltage variable in inverse proportion to said amplified signal generated by said amplifier section and referred to a further reference voltage.

5. An operational power circuit according to claim 4, wherein said variable voltage generator comprise an operational amplifier having its own inverting input, its own non-inverting input, its own output and its own feedback network comprising a third resistor connected between said own inverting input and said own output and a fourth resistor connected between said own inverting input and said amplifier output of said amplifier section, said own non-inverting input being connected to a line set to said further reference voltage.

* * * * *